United States Patent
Monahan

(10) Patent No.: US 7,276,839 B1
(45) Date of Patent: Oct. 2, 2007

(54) BONDABLE FLUOROPOLYMER FILM AS A WATER BLOCK/ACOUSTIC WINDOW FOR ENVIRONMENTALLY ISOLATING ACOUSTIC DEVICES

(75) Inventor: Patrick J. Monahan, Gales Ferry, CT (US)

(73) Assignee: The United States of America represented by the Secretary of the Navy, Washington, DC (US)

( * ) Notice: Subject to any disclaimer, the term of this patent is extended or adjusted under 35 U.S.C. 154(b) by 125 days.

(21) Appl. No.: 11/296,713

(22) Filed: Nov. 30, 2005

(51) Int. Cl.
*H01L 41/053* (2006.01)
(52) U.S. Cl. ............... 310/337; 310/322; 310/340; 310/344
(58) Field of Classification Search ........ 310/337–338, 310/324, 322, 334, 344
See application file for complete search history.

(56) References Cited

U.S. PATENT DOCUMENTS

| | | |
|---|---|---|
| 4,399,526 A | 8/1983 | Eynck |
| 4,759,000 A | 7/1988 | Reitz |
| 4,943,473 A | 7/1990 | Sahatjian et al. |
| 4,999,819 A * | 3/1991 | Newnham et al. .......... 367/157 |
| 5,016,228 A * | 5/1991 | Arnold et al. .............. 367/163 |
| 5,114,982 A | 5/1992 | Mendelsohn et al. |
| 5,355,048 A | 10/1994 | Estes |
| 5,972,450 A | 10/1999 | Hsich et al. |
| 6,172,940 B1 | 1/2001 | McConnell et al. |
| 6,177,189 B1 | 1/2001 | Rawlings et al. |
| 6,182,341 B1 | 2/2001 | Talbot et al. |
| 6,555,947 B2 * | 4/2003 | Bahk et al. ................. 310/337 |
| 2001/0008665 A1 | 7/2001 | Hsich et al. |
| 2001/0050197 A1 * | 12/2001 | Wood ......................... 181/292 |
| 2004/0026106 A1 * | 2/2004 | Peinsipp et al. ........... 174/52.3 |
| 2006/0046123 A1 * | 3/2006 | Guo et al. .................... 429/34 |

* cited by examiner

*Primary Examiner*—Darren Schuberg
*Assistant Examiner*—Derek Rosenau
(74) *Attorney, Agent, or Firm*—James M. Kasischke; Michael P. Stanley; Jean-Paul A. Nasser

(57) ABSTRACT

A combination transducer and water-blocking film for acoustic signaling through ambient water. The water-blocking film has an etched fluoropolymer film and adjacent bonding film interposed between the transducer and the water. Potting material extends adjacent to and is bonded to both sides of the water-blocking film. The film and potting material create an acoustic window. The etched fluoropolymer film is approximately one to two thousandths inch thick and the bonding film is approximately one thousandths inch thick, and the potting material is a polyurethane matrix.

10 Claims, 3 Drawing Sheets

BONDABLE FLUOROPOLYMER FILM AS A WATER BLOCK/ACOUSTIC WINDOW FOR ENVIRONMENTALLY ISOLATING ACOUSTIC DEVICES

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention relates to acoustic transducers. More particularly, the invention relates to a cost-effective and reliable device that simultaneously functions as a barrier for water and an acoustic window for acoustic signals in a water medium.

(2) Description of the Prior Art

Instrumentation/sensor packages for use underwater usually must be waterproof in order to function reliably. In addition to needing a water barrier, acoustic transducer packages used for undersea detection and/or communications further require a reasonable acoustic match through what is called an acoustic window to the surrounding water medium. Transducers operating in the active mode (projecting acoustic signals into ambient water) and/or passive mode (receiving acoustic signals from ambient water) need an acoustic window capable of responsively, bi-directionally passing the acoustic signals to and from the ambient water medium.

Contemporary acoustic windows seal acoustic devices while allowing acoustic signals to pass to the device. The devices typically consist of a minimal layer of water-blocking material such as neoprene, nitrile, or ethylene propylene diene terpolymer (EDPM) rubber and an intermediate layer of acoustically acceptable material such as caster oil or polyurethane. The water-blocking layers described are not good Rho-C matches to water and are therefore applied at a minimal thickness so as not interfere with the signal. The water-blocking layers also require an elevated temperature and pressure cure that can be harmful to the components of the acoustic device. As a result, the water-blocking layer is fabricated as an envelope or boot. The acoustic device is placed inside the water-blocking enclosure which is then backfilled with the Rho-C matching materials described.

Other water-proofing and engineering materials have been applied to acoustic windows to enhance their physical performance. One such application is the bonding of a thin titanium sheet (about 1/31" thick) to an acoustic array for added impact resistance. Another application is gold plated titanium foil which is wrapped around a polyurethane molded acoustic device and local preamplifier for the purpose of water-proofing and electronic shielding. However, working with titanium is difficult, and without gold plating it is expensive.

One type of acoustic window not to be confused with the invention herein described is the hydrodynamic fairing such a bow dome on a ship or submarine that is placed over an acoustic sensor or array of such sensors. These hydrodynamic fairings typically are freely-flooded with a layer of water between the fairing and the acoustic transducer elements and protect against damage from impact.

Thus, a need exists for a thin layer of etched (chemical or radiation etched) fluoropolymer bonded into potting materials for stopping water permeation in undersea instrumentation packages including acoustic transducers. The layer should be inexpensive and easy to work with and a better waterblocker than neoprene, nitrile, or ethylene propylene diene terpolymer (EDPM) rubber etc.

SUMMARY OF THE INVENTION

It is therefore an object of the invention to provide a thin-film water barrier on submerged electronic components such as acoustic transducers to assure environmental isolation and to increase component life.

It is a further an object of the invention to provide an acoustic transducer with a thin-film water barrier that also provides an acoustic window for operation in the active mode and/or passive mode.

It is a still further an object of the invention to provide underwater electronic components having a metalized fluoropolymer thin-film covering to environmentally isolate and electrically shield components.

It is still further object of the invention to waterblock an electronic device transducer for use in a closely confined space.

It is still further object of the invention to waterblock a mounted device such that the overall dimensions of the device are minimally increased.

It is still further an object of the invention to provide an acoustic transducer enclosed in a water-blocking film that through minimal window thickness (~0.003") minimizes transmission or insertion loss through the acoustic window of the transducer.

It is still further an object of the invention to provide an acoustic transducer having a water-blocking film adjacent to a potting material layer to prevent leakage of the compound and corrosion of components.

It is still a further object of the invention to provide an acoustic transducer enclosed in a water-blocking film to minimize potting dimensions and permit higher frequency responsiveness especially when placed very near a rigid baffle.

These and other objects of the invention will become more readily apparent from the ensuing specification when taken in conjunction with the appended claims.

Accordingly, the present invention is a combination acoustic transducer and water-blocking thin film that has a transducer for acoustic signals through ambient water. The water-blocking film has an etched fluoropolymer film and adjacent bonding film interposed between the acoustic transducer and the water. Potting material extends adjacent to and is bonded to both sides of the water-blocking film by the bonding film. The water-blocking film and potting material create an acoustic window to the water. The etched fluoropolymer film is approximately one to two thousandths inch thick and the bonding film is approximately one thousandths inch thick, and the potting material is a polyurethane matrix. The water-blocking film and potting material can form a closed envelope to contain the transducer elements or a housing might be used. A rigid baffle can be added to enhance performance, or an accelerometer can be used in place of the acoustic transducer.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals refer to like parts and wherein.

DESCRIPTION OF THE PREFERRED EMBODIMENTS

Figure 1A:
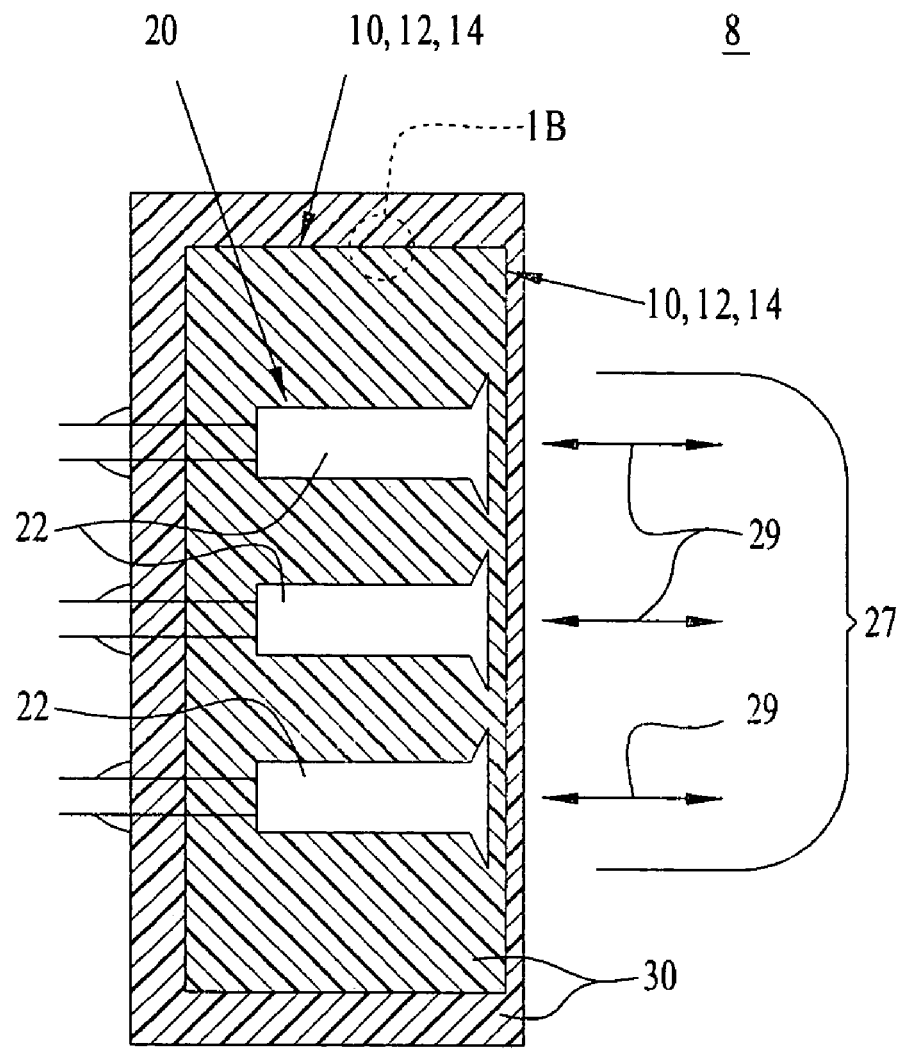
FIG. 1A is a cross-sectional view depicting water-blocking film including a blown-up portion extending within polyurethane potting material at the acoustic window of a transducer array and around the transducer.
Figure 1B:
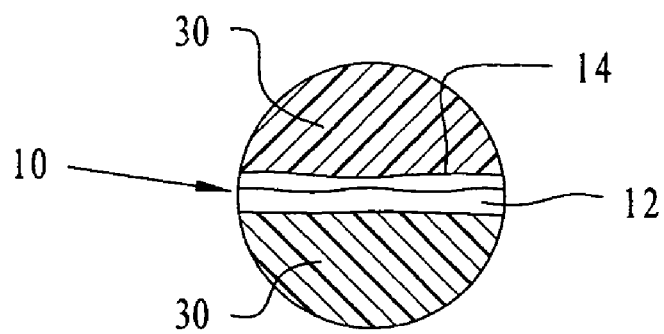
FIG. 1B is a cross-sectional view depicting a magnified section of the water-blocking film with the view taken from reference section 1B of FIG. 1A.
Figure 2:
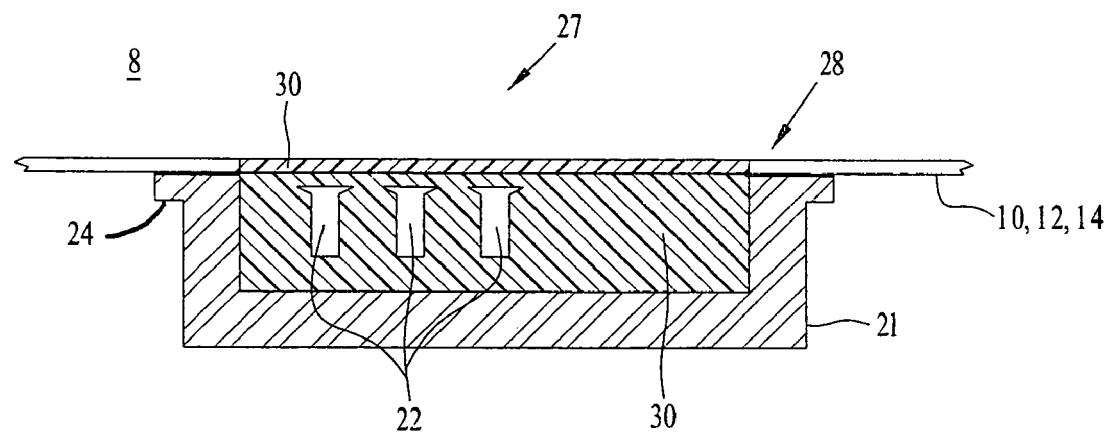
FIG. 2 is a cross-sectional view depicting water-blocking film extending across polyurethane potting material at the acoustic window of a transducer and connected to a housing around the periphery of the acoustic window.

Referring now to FIGS. 1A, 1B, and 2, water-blocking film 10 of the invention is mounted to extend across an acoustic transducer 20, or other instrumentation package deployed in ambient water 8. The acoustic transducer 20 includes an array of one or more transducer elements 22, known in the art, that can each be made up from stacks of ferroelectric, piezoelectric, magnetostrictive, or other driving-sensing elements having interleaved electrical conductors and magnesium head masses. The transducer elements 22 can sense impinging acoustic signals from the ambient water 8 in the passive mode and/or project acoustic signals through the ambient water in the active mode.

The water-blocking film 10 is the primary barrier for the ambient water 8 from the transducer elements 22 and other internal components of the acoustic transducer 20. The water-blocking film 10 has a thin film 12 of etched fluoropolymer material (having a thickness of about one or two thousandths of an inch and a thin bonding film of liquid urethane or epoxy 14 (having a thickness of approximately one thousandths of an inch) that can be applied to both sides of the fluoropolymer film 12.

The fluoropolymer thin film 12 is etchable, and can therefore be etched by chemical, radiation or plasma means to provide a sufficiently rough surface for the liquid urethane thin film 14 to adhere to—for displacing air and bonding onto other parts as described below. Because the etched fluoropolymer thin film 12 and urethane thin film 14 of the water-blocking film 10 by themselves have relatively poor conductive properties for acoustic energy, the thickness of the water-blocking film 10 is made to be minimal, or almost negligible (approximately three or four thousandths of an inch thick) with respect to the wavelengths of the acoustic frequency range of the acoustic transducer 20.

Typically, wavelengths for frequencies in this range can be one inch for sixty kilohertz, two inches for thirty kilohertz, four inches for fifteen kilohertz, and eight inches for seven point five kilohertz. Consequently, the etched fluoropolymer thin film 12 (with the film 14) has minimum transmission or insertion loss on typical sonar signals transmitted through the films 12 and 14. Therefore, the film 12 can be added to traditional acoustic window designs to assure watertight integrity without compromising acoustic capabilities. Adding the etched fluoropolymer thin film 12 of the water-blocking film 10 to some existing transducer designs can also replace conventional thick rubber or polymer skins (i.e., do away with the skins completely, to improve operational parameters).

The water-blocking film 10 has a potting material 30; e.g. a polyurethane matrix bonded or adhered the flat surfaces presented by its opposite flat sides to extend across the transducer elements 22 of the transducer 20 in what is known as an acoustic window 27. This bonding can be made by done as bonding film 14 of the water-blocking film 10 cures. The acoustic window 27 is where impinging and projected acoustic signals (shown as bidirectional arrows 29) pass with reduced transmission or insertion losses as compared to other surface areas of the transducer 20. The water-blocking film 10 reaches across the transducer elements 22 and around them inside of the polyurethane matrix potting material 30 in such a fashion that the water-blocking film 10 and the potting material form a closed envelope to enclose or contain the transducer elements of the transducer, as shown in FIG. 1A. Watertight integrity of the transducer 20 by the etchable fluoropolymer film 12 of the water-blocking film 10 is thereby assured.

Optionally, the water-blocking film 10 and the polyurethane matrix potting material 30 could be connected in an annular sealed fitting 24 to a can-shaped rigid housing 21 at a periphery 28 of the acoustic window 27, as shown in FIG. 2. The potting material 30 is on both sides of water-blocking film 10 and around the transducer elements 22 and may or may not be along the periphery 28 (the potting material 30 is not shown along the periphery 28 in the figure) where the sealed fitting 24 is made.

In the acoustic window 27 of this embodiment, some polyurethane matrix potting material 30 and water-blocking film 10 of the acoustic window 27 are interposed between the ambient water 8 and other components including the transducer elements 22. These interpositions help to protect those components from abrasion and impact. The epoxy (or liquid urethane) of the thin film 14 can be used to assure the sealed fitting 24 between the water-blocking film 10 of the acoustic window 27 and the housing 21. Additional epoxy could be added. The housing 21 and the acoustic window 27 (including water-blocking film 10 and potting material 30) complete the watertight enclosure of the transducer elements 22 and other internal components.

Contrary to this invention, contemporary transducer designs use only a protective layer of potting material at the transducer's acoustic window (no water-blocking film 10 including etched fluoropolymer film 12). Virtually all contemporary potting materials permit water permeation. Therefore, using only a layer of such potting material enables water from the ambient water to be absorbed and permeated through the potting material layer and into the selected transducer. In this situation, the leaked water could create electrical shorts, increased IR losses, reduced insulation resistance, and produce corrosion in magnesium head masses, conductors and other parts susceptible to oxidation and other corrosive deteriorations activated by leaked water.

Such permeation of water cannot occur in the transducer 20 having the water-blocking film 10 interposed between the transducer elements 22 and in the polyurethane matrix potting material 30 next to the ambient water 8 at the acoustic window 27. As shown in FIG. 1A, the water-blocking film 10 can extend to cover not only the acoustic window 27 but all transducer elements 22 of the transducer 20 in a closed envelope. Due to the thin profile of the water-blocking film 10 (approximately one to four thousandths of an inch), the water-blocking film has virtually no effect on typical sonar signals yet eliminates an otherwise costly and relatively thick rubber or polymer skin that can be difficult to apply.

Figure 3:
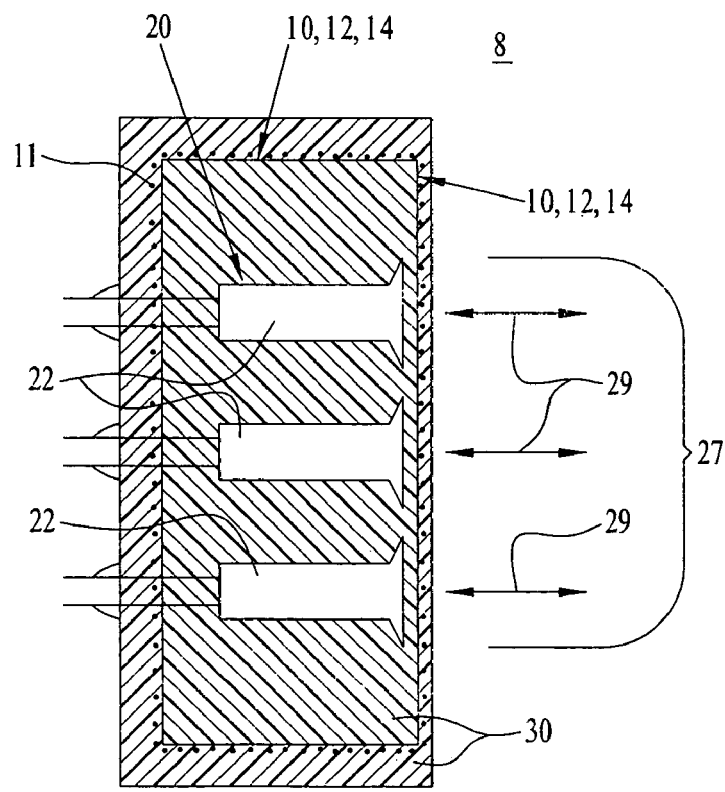
FIG. 3 is a cross-sectional view depicting water-blocking film having metallization and extending within polyurethane potting material at the acoustic window of a transducer array and around the transducer.

FIG. 3 depicts metallization 11 on the water-blocking film 10 that extends around the potting material 30 and transducer elements 22 similar to the configuration of FIG. 1A. The metalization of water-blocking film 10 can be accomplished by any of a number of procedures known to those skilled in the art and still function to provide isolation from the environment as described. The metallization 11 of the water-blocking film 10 further environmentally isolates electronic components and devices by electrically shielding these components.

Figure 4:
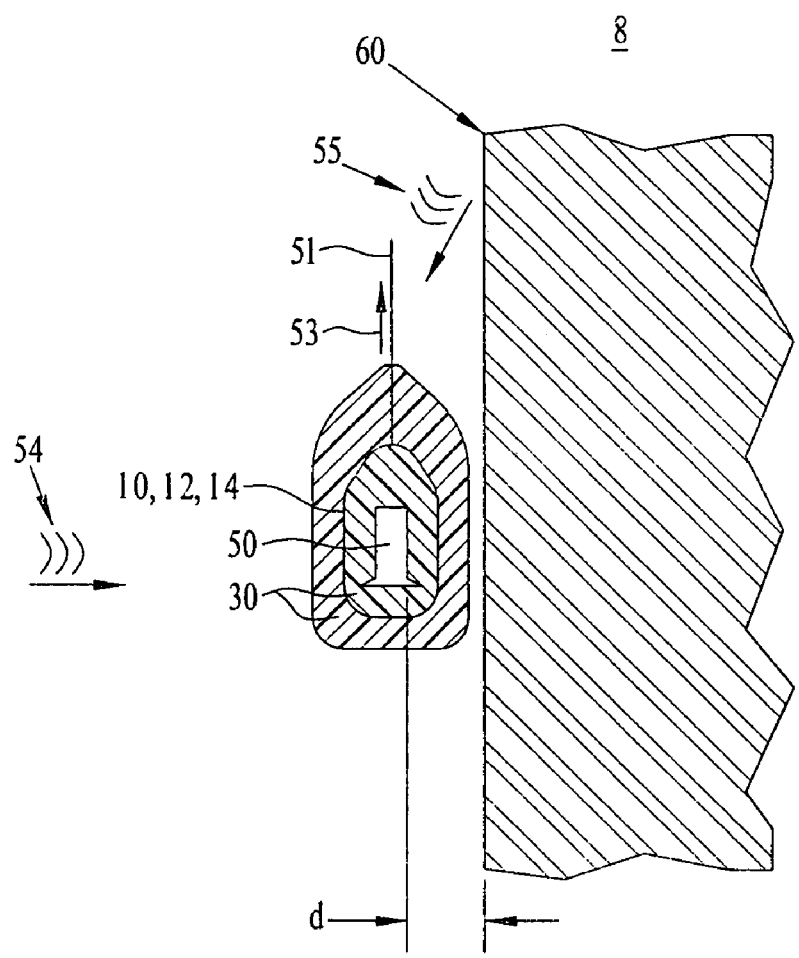
FIG. 4 is a cross-sectional view depicting a submerged acoustic sensor next to a rigid baffle and enclosed in an envelope of water-blocking film.

Referring now to FIG. 4, the water-blocking film 10 (the etched fluoropolymer thin film 12 and urethane thin film 14) is shaped as a closed sealed envelope containing an acoustic transducer 50, with the polyurethane matrix potting material 30 covering both the acoustic transducer and both sides of the water-blocking film 10. The acoustic transducer 50, polyurethane matrix potting material 30, and water-blocking film 10 are located adjacent to a rigid baffle 60 in the ambient water 8. The acoustic transducer 50 is separated from the rigid baffle 60 at a distance "d" that is less than ¼ of the length of the wavelength of the frequency of interest. This distance precludes signal cancellation that could otherwise occur at ¼ wavelength separation. For example, a received information signal at 30 KHz would have a wavelength of two inches and the separation between the acoustic transducer 50 and the rigid baffle 60 would have to be less than one-half inch.

The envelope-shaped water-blocking film 10 can be made as described above, and can contain a minimal amount of polyurethane matrix potting material 30 so that the polyurethane matrix potting material and urethane thin film 14 fill any spaces around the acoustic transducer 50 and between the inside of the envelope-shaped water-blocking film 10 and the transducer 50 to eliminate air spaces.

The rigid baffle 60 enhances performance by reflecting acoustic signals 55 to the transducer 50. Virtually all of the envelope-shaped water-blocking film 10 can function as an acoustic window to receive impinging acoustic signals 54 directly from the ambient water 8 and to receive reflected acoustic signals 55 from the baffle 60. Since minimal amounts of the potting material 30 are used on both sides of the envelope-shaped water-blocking film 10, the transducer 50 can be capable of higher frequency sensing of impinging acoustic signals 54. This higher frequency sensing capability is also the result of locating the sensing transducer 50 closer to the rigid baffle 60 as described above.

Signal leads 51 extend from the transducer 50 through the envelope-shaped water-blocking film 10 to carry signals (shown by arrow 53) representative of directly sensed and reflected acoustic signals, 55 to distant instrumentation (not shown).

Since the liquid urethane thin film 14 is directly applied on the outsides of the fluoropolymer thin film 12, the envelope-shaped water-blocking film 10 can be made from a sheet of fluoropolymer film 12 folded to closely conform to the outer contours of the transducer 50 to reduce the amount of polyurethane matrix potting material 30 adjacent to the transducer 50. The tacky, adhering urethane thin film 14 will hold its folded shape that will displace air and bond to itself and adjacent polyurethane matrix potting material 30. This close conforming, possible by envelope-shaped water-blocking film 10, can further improve not only the responsiveness of the transducer 50 to impinging and reflected signals 54, 55, but this close conforming can be adapted to the other embodiments of the invention herein described to improve their acoustic transmissions as well.

Figure 5:
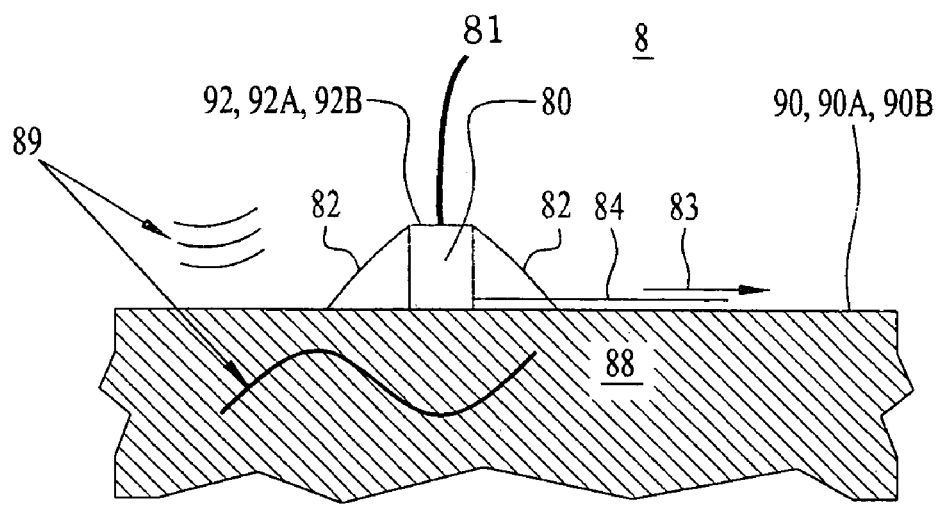
FIG. 5 is a cross-sectional view depicting an undersea accelerometer package having moment minimizing upper and lower layers of water-blocking film.

Referring now to FIG. 5, a small cylinder-shaped accelerometer 80 is mounted on a water-blocking film 90 of etched fluoropolymer film 90A and urethane (or epoxy) film 90B that is bonded onto a polymer layer 88. The accelerometer 80 can be a small cylinder of piezoelectric material to measure up-and-down accelerations of the polymer layer 88 that are caused by acoustic waves 89 from the ambient water 8 entering the polymer layer. A small ring-shaped piece of flotation material 82, such as syntactic foam is attached to the thin film 90 to provide sufficient buoyancy to make the accelerometer 80 neutrally buoyant in ambient water 8. Syntactic foam is a term used by artisans and engineers who work with marine equipments and refers to materials comprising a dispersion of gas in a solid material, such as polyurethane which is employed to fill space and/or provide buoyancy.

A small disc of water-blocking film 92 of fluoropolymer 92A and urethane film 92B covers and is adhered to the top ends of piezoelectric cylinder 81 and the ring-shaped flotation material 82 to seal the top ends from the ambient water 8.

The accelerometer 80 can be a commercially available unit bonded to the thin film 90 to provide signals (shown as arrow 83) on lead 84 representative of accelerations or displacements of the thin film 90 that may be caused by the acoustic energy 89 coming through the ambient water 8. The water-blocking films 90 and 92 of one to four mil thick fluoropolymer and urethane block water from the accelerometer 80 and have thinness to reduce the moment. The water-blocking films 90 and 92 do not add any appreciable height (mass) loading that might adversely create moment for the accelerometer 80 and influence validity of the signals represented by the arrow 83.

Although only a single accelerometer 80 is depicted, it is to be understood that many such accelerometers could be mounted on the thin film 90 to span a considerable area. Accurate and effective large scale monitoring of impinging acoustic energy and other vibrations can be made with one or more accelerometers as described.

In all applications described hereinabove, the etched water-blocking films 10, 90, 92 having fluoropolymer films can be metalized by vapor deposition, see in particular the embodiment of FIG. 3. Having a metalized fluoropolymer thin-film provides an additional level of environmental isolation by the electrical shielding of components.

It is understood that other equivalent compositions for water-blocking film 10 could be made in accordance with this invention to allow improved underwater operation of many different types of instrumentations for reliable use underwater. One skilled in the art to which this invention applies could make such selections without departing from the scope of this invention herein described. Having this disclosure in mind, selection of suitable components from among many proven contemporary designs and compactly interfacing them with the water-blocking film 10 can be readily done.

The disclosed components and their arrangements as disclosed herein all contribute to the novel features of this invention. The water-blocking film 10 in cooperation with the transducer elements 22, accelerometer 80 and other instrumentation packages assure water blockage for long term reliable operation in harsh marine environments. The water-blocking film 10 assures not only improved reliability, but additionally provides a cost-effective means for achieving this reliability. Therefore, the water-blocking film 10 and uses of film 10 as disclosed herein is not to be construed as limiting, but rather, is intended to be demonstrative of this inventive concept.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A combination transducer and water-blocking thin film, said combination comprising:
    an acoustic transducer for acoustic signals through ambient water;
    an etched fluoropolymer film;
    bonding film adjacent to said etched fluoropolymer film and interposed between said acoustic transducer and said the ambient water;
    potting material extending adjacent and bonded to both sides of said water-blocking film by said bonding film;
    wherein etched fluoropolymer film and said bonding film form said water-blocking film creating an acoustic window between said acoustic transducer and the ambient water; and
    wherein said etched fluoropolymer film is approximately one to two thousandths of an inch thick, said bonding film is approximately one thousandths of an inch thick, and said potting material is a polyurethane matrix.

2. The combination of claim 1 wherein said acoustic transducer includes a plurality of transducer elements and said water-blocking film extends through said potting material between said transducer elements and the ambient water.

3. The combination of claim 2 wherein said water-blocking film and said potting material form a closed envelope containing said transducer elements.

4. The combination of claim 2 further comprising:
    a housing containing said transducer elements and being connected to said acoustic window for completing a watertight enclosure of said transducer.

5. A combination transducer and water-blocking thin film, said combination comprising:
    an acoustic transducer;
    an etched fluoropolymer film being approximately one to two thousandths of an inch thick;
    bonding film adjacent to said etched fluoropolymer film and interposed between said transducer and the ambient water said bonding film being approximately one thousandths of an inch thick wherein etched fluoropolymer film and said bonding film form said water-blocking film capable of creating an acoustic window between said transducer and the ambient water;
    potting material extending adjacent and bonded to both sides of said water-blocking film by said bonding film, and said potting material being a polyurethane matrix; and
    a rigid baffle adjacent to and separated from said water blocking film and said potting material, said baffle capable of reflecting acoustic signals to said transducer and said water-blocking film and said potting material layer to form a closed envelope containing said transducer.

6. The combination of claim 5 wherein said water-blocking envelope and said potting material act as an acoustic window receiving impinging acoustic signals directly from said ambient water and receiving said reflected acoustic signals from said baffle.

7. The combination of claim 6 wherein said transducer is separated from said rigid baffle at a distance less than ¼ of the length of the wavelength of the frequency of interest.

8. A combination accelerometer and water-blocking thin films comprising:
    an accelerometer for sensing acoustic energy from ambient water;
    a ring of flotation material encompassing said accelerometer for making said accelerometer neutrally buoyant;
    a first water-blocking film of etched fluoropolymer film and bonding film extending across and connected to bottoms of said accelerometer and said flotation material ring and connected to a polymer layer; and
    a second disc-shaped water-blocking film of etched fluoropolymer film and bonding film extending across and connected to tops of said accelerometer and said flotation material, said first and second water-blocking films forming an acoustic window for incoming acoustic energy.

9. The combination of claim 8 wherein said first and second water-blocking thin films seal the bottoms and tops of said accelerometer and said flotation material and reduce mass of said acoustic window.

10. The combination of claim 9 wherein said fluoropolymer thin-film is metalized for electrically shielding components.

\* \* \* \* \*